United States Patent
Park et al.

(10) Patent No.: US 11,355,349 B2
(45) Date of Patent: Jun. 7, 2022

(54) METHOD OF MANUFACTURING SEMICONDUCTOR DEVICE

(71) Applicant: SAMSUNG ELECTRONICS CO., LTD., Suwon-si (KR)

(72) Inventors: Sung-Min Park, Hwaseong-si (KR); Se Myeong Jang, Hwaseong-si (KR); Bong Soo Kim, Hwaseong-si (KR); Je Min Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/032,356

(22) Filed: Sep. 25, 2020

(65) Prior Publication Data

US 2021/0013046 A1    Jan. 14, 2021

Related U.S. Application Data

(62) Division of application No. 16/250,180, filed on Jan. 17, 2019, now Pat. No. 10,867,802.

(30) Foreign Application Priority Data

Jul. 30, 2018    (KR) .................. 10-2018-0088539

(51) Int. Cl.
*H01L 21/308* (2006.01)
*H01L 21/033* (2006.01)
*H01L 21/762* (2006.01)

(52) U.S. Cl.
CPC ...... *H01L 21/3081* (2013.01); *H01L 21/0332* (2013.01); *H01L 21/0337* (2013.01); *H01L 21/76224* (2013.01)

(58) Field of Classification Search
None
See application file for complete search history.

(56) References Cited

U.S. PATENT DOCUMENTS

| 6,933,187 B2 | 8/2005 | Jang |
| 7,977,204 B2 | 7/2011 | Kim et al. |
| 8,026,179 B2 | 9/2011 | Lue |

(Continued)

FOREIGN PATENT DOCUMENTS

| KR | 10-2010-0068789 A | 6/2010 |
| KR | 10-2010-0079981 A | 7/2010 |

*Primary Examiner* — Jay C Chang
(74) *Attorney, Agent, or Firm* — Lee IP Law, PC

(57) ABSTRACT

A method includes forming hard mask patterns by depositing a support mask layer, a polycrystalline silicon layer, and a hard mask layer on a substrate and etching the hard mask layer, forming pre-polycrystalline silicon patterns by etching the polycrystalline silicon layer using the hard mask patterns as an etch mask, oxidizing side surfaces of the pre-polycrystalline silicon patterns to form polycrystalline silicon patterns and a silicon oxide layer, forming spacer patterns covering sides of the silicon oxide layer, forming a sacrificial layer on a top surface of the support mask layer to cover the silicon oxide layer and the spacer patterns, etching the sacrificial layer and the silicon oxide layer, forming support mask patterns by etching the support mask layer using the polycrystalline silicon patterns and the spacer patterns as an etch mask, and forming activation pins by etching the substrate using the support mask patterns as an etch mask.

20 Claims, 15 Drawing Sheets

(56) References Cited

U.S. PATENT DOCUMENTS

| | | |
|---|---|---|
| 8,084,319 B2 | 12/2011 | Peng et al. |
| 8,242,022 B2 | 8/2012 | Kim |
| 8,525,235 B2 | 9/2013 | Cheng et al. |
| 8,796,155 B2 | 8/2014 | Sills et al. |
| 9,330,931 B2 | 5/2016 | Song et al. |
| 9,343,309 B1 | 5/2016 | Bangar et al. |
| 9,721,784 B2 | 8/2017 | Behera et al. |
| 9,892,925 B2 | 2/2018 | Cheng et al. |
| 2007/0099431 A1* | 5/2007 | Li .................. H01L 21/3086 438/735 |
| 2010/0167548 A1* | 7/2010 | Kim .................. H01L 21/0338 438/694 |
| 2012/0085733 A1 | 4/2012 | Mebarki et al. |
| 2012/0164390 A1 | 6/2012 | Washburn et al. |

* cited by examiner

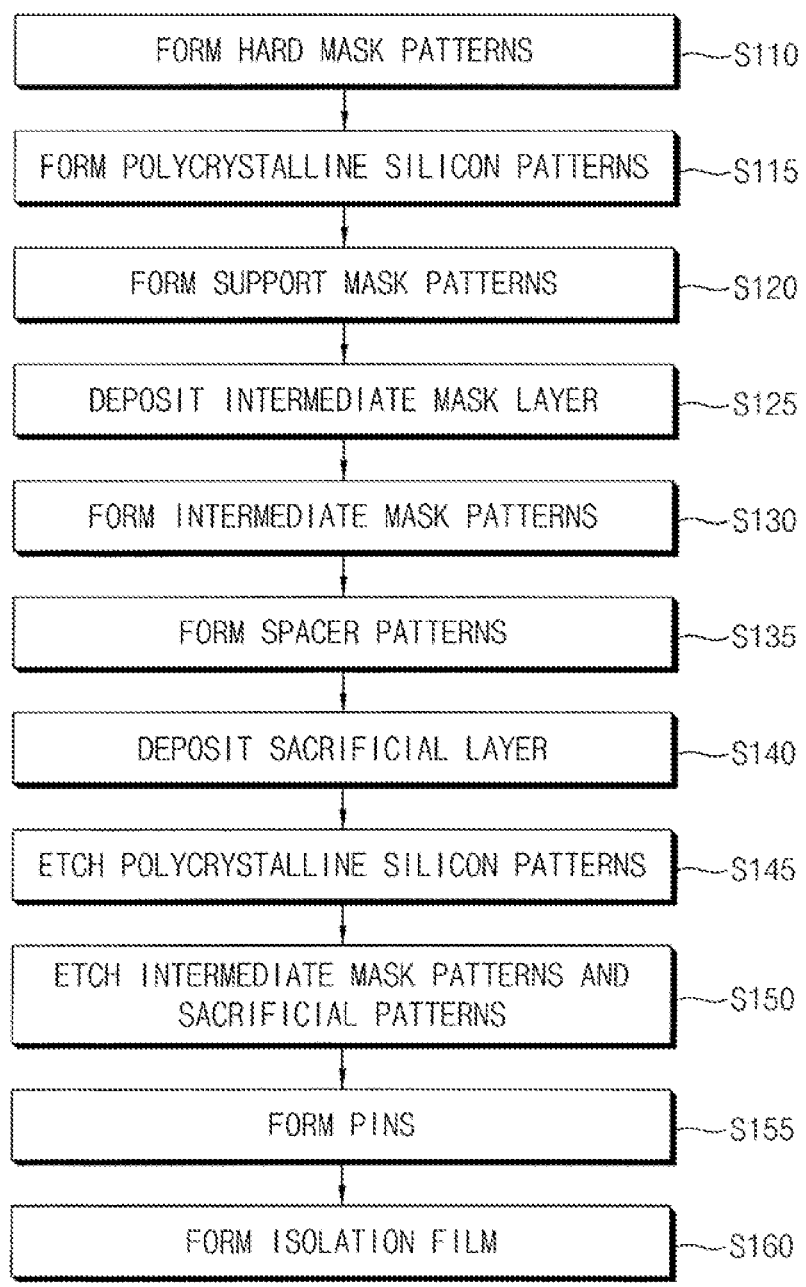

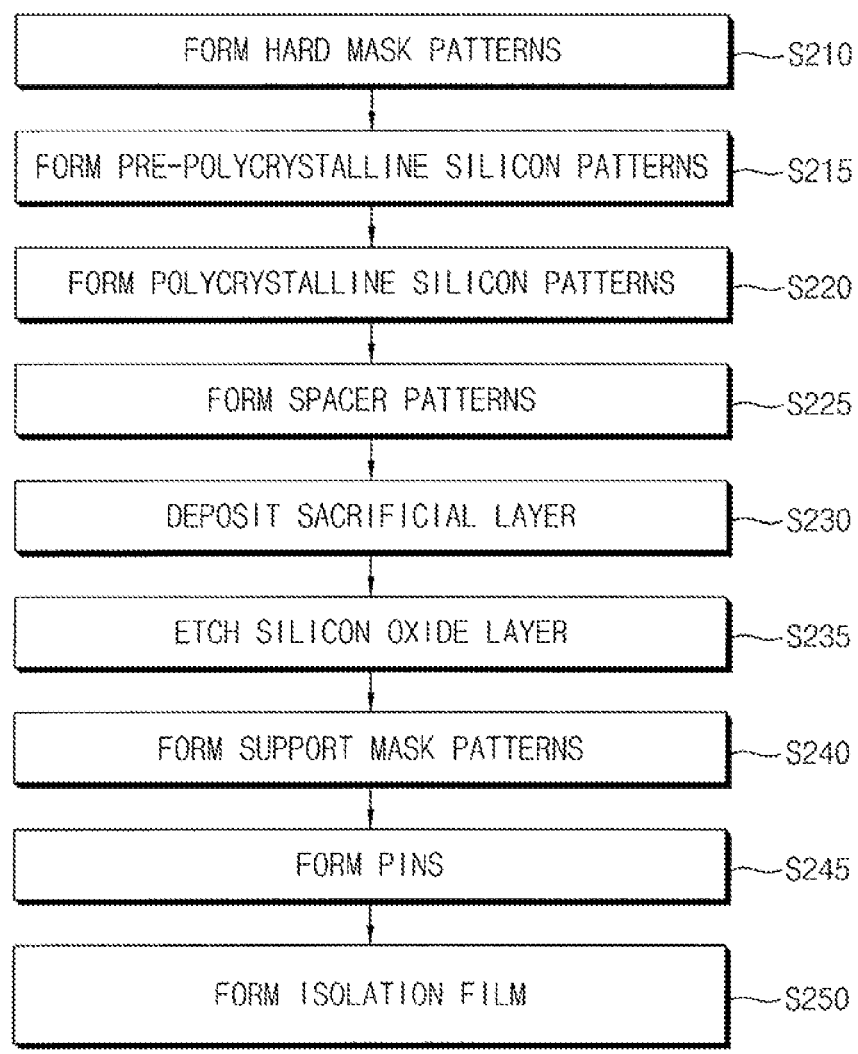

METHOD OF MANUFACTURING SEMICONDUCTOR DEVICE

CROSS-REFERENCE TO RELATED APPLICATIONS

This is a divisional application based on pending application Ser. No. 16/250,180, filed Jan. 17, 2019, the entire contents of which is hereby incorporated by reference.

Korean Patent Application No. 10-2018-0088539, filed on Jul. 30, 2018, in the Korean Intellectual Property Office, and entitled: "Method of Manufacturing Semiconductor Device," is incorporated by reference herein in its entirety.

BACKGROUND

1. Field

Embodiments relate to a method of manufacturing a semiconductor device.

2. Description of the Related Art

As an increase in the integration degrees of semiconductor devices has continued, design rules of components thereof have been reduced. As the integration degree of a semiconductor device is further increased, critical dimensions of fine patterns may become less than a threshold value of a resolution in an existing photolithography process.

SUMMARY

Embodiments are directed to a method of manufacturing a semiconductor device, the method including forming hard mask patterns by sequentially depositing a support mask layer, a polycrystalline silicon layer, and a hard mask layer on a substrate and etching the hard mask layer; forming polycrystalline silicon patterns by etching the polycrystalline silicon layer using the hard mask patterns as an etch mask, and forming pre-support mask patterns by etching the support mask layer; forming support mask patterns by etching the pre-support mask patterns; forming an intermediate mask layer on a top surface of the substrate to cover side surfaces of the support mask patterns and side surfaces of the polycrystalline silicon patterns; forming intermediate mask patterns by anisotropically etching the intermediate mask layer using the polycrystalline silicon patterns as an etch mask; forming spacer patterns covering side surfaces of the intermediate mask patterns; forming a sacrificial layer covering the spacer patterns and the polycrystalline silicon patterns; forming sacrificial patterns and exposing the polycrystalline silicon patterns by etching the sacrificial layer, and etching the sacrificial patterns and the polycrystalline silicon patterns together; removing the intermediate mask patterns and the sacrificial patterns by etching; and forming activation pins by etching the substrate using the support mask patterns and the spacer patterns as an etch mask.

According to example embodiments, there is provided a method of manufacturing a semiconductor device, the method including forming hard mask patterns by sequentially depositing a support mask layer, a polycrystalline silicon layer, and a hard mask layer on a substrate and etching the hard mask layer; forming pre-polycrystalline silicon patterns by etching the polycrystalline silicon layer using the hard mask patterns as an etch mask; oxidizing opposite side surfaces of the pre-polycrystalline silicon patterns to form polycrystalline silicon patterns and a silicon oxide layer; forming spacer patterns covering side surfaces of the silicon oxide layer; forming a sacrificial layer on a top surface of the support mask layer to cover the silicon oxide layer and the spacer patterns; etching the sacrificial layer and the silicon oxide layer; forming support mask patterns by etching the support mask layer using the polycrystalline silicon patterns and the spacer patterns as an etch mask; and forming activation pins by etching the substrate using the support mask patterns as an etch mask.

According to example embodiments, there is provided a method of manufacturing a semiconductor device by forming an activation pin unit including three activation pins spaced apart from one another, the method including forming a support mask layer on a substrate; forming polycrystalline silicon patterns, spacer patterns, and a silicon oxide layer on the support mask layer, the polycrystalline silicon patterns being located on a location corresponding to a central activation pin among the activation pins, the spacer patterns being located on locations corresponding to the other activation pins at opposite sides of the activation pin unit, and the silicon oxide layer having a width corresponding to a distance between the activation pins and being located between the polycrystalline silicon patterns and the spacer patterns; forming a sacrificial layer on the support mask layer to cover the polycrystalline silicon patterns, the spacer patterns, and the silicon oxide layer, the sacrificial layer having a top surface forming a plane; and etching the sacrificial layer and the silicon oxide layer together to expose a top surface of the support mask layer.

BRIEF DESCRIPTION OF THE DRAWINGS

Features will become apparent to those of skill in the art by describing in detail example embodiments with reference to the attached drawings in which:

FIG. 1 illustrates a flowchart of a semiconductor device manufacturing method according to an example embodiment;

FIG. 3 illustrates a flowchart of a semiconductor device manufacturing method according to an example embodiment;

DETAILED DESCRIPTION

Figure 2A:
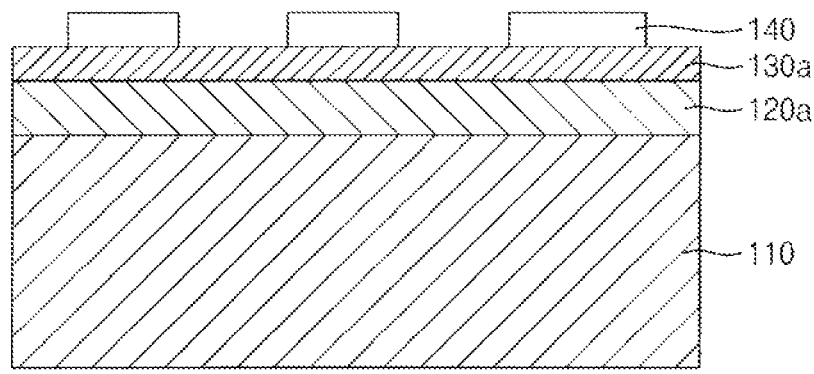
FIGS. 2A to 2K illustrate cross-sectional views of stages of a semiconductor device manufacturing method according to an example embodiment.

Hereinafter, semiconductor device manufacturing methods according to example embodiments will be described.

First, a semiconductor device manufacturing method according to an example embodiment will be described below.

FIG. 1 is a flowchart illustrating a semiconductor device manufacturing method according to an example embodiment. FIGS. 2A to 2K are cross-sectional views illustrating a semiconductor device manufacturing method according to an example embodiment.

Referring to FIGS. 1 and 2A to 2K, the semiconductor device manufacturing method according to the example embodiment may include forming hard mask patterns (S110), forming polycrystalline silicon patterns (S115), forming support mask patterns (S120), depositing an intermediate mask layer (S125), forming intermediate mask patterns (S130), forming spacer patterns (S135), depositing a sacrificial layer (S140), etching the polycrystalline silicon patterns (S145), etching the intermediate mask patterns and sacrificial patterns (S150), forming pins (S155), and forming an isolation film (S160).

In the semiconductor device manufacturing method according to an example embodiment, activation pins are formed on a substrate using triple pattern technology, a process may be simplified, and fine critical dimension may be achieved. In the semiconductor device manufacturing method according to an example embodiment, three activation pins may be formed using one photomask. Thus, in the semiconductor device manufacturing method according to an example embodiment, three pins may be formed as one activation pin unit. In the semiconductor device manufacturing method according to an example embodiment, left and right activation pins among the activation pins may be formed to have the same width. In the semiconductor device manufacturing method according to an example embodiment, a central activation pin and the remaining side activation pins among the three activation pins of the activation pin unit may be formed to have different widths. In the semiconductor device manufacturing method according to an example embodiment, the central activation pin of the activation pin unit may be spaced the same distance from the left and right activation pins.

In another example embodiment, a plurality of activation pin units may be formed on one substrate to be spaced different distances from each other. In another example embodiment, activation pins of a plurality of activation pin units may be formed to have different widths. For example, a left activation pin of one activation pin unit and a left activation pin of another activation pin unit may be formed to have different widths. In another example embodiment, a central activation pin of one activation pin unit and a central activation pin of another activation pin unit may be formed to have different widths.

In the semiconductor device manufacturing method according to an example embodiment, a process may be simplified as compared to quadruple pattern technology. For example, in the semiconductor device manufacturing method according to an example embodiment, only a one-stage hard mask stack may be used as compared to quadruple pattern technology using a two-stage mask stack. By using the one-stage mask stack, it may thus be possible to increase a margin for prevention of the collapse of pins during a process, and to reduce distance dispersion between the pins.

Referring to FIGS. 1 and 2A, in the forming of the hard mask pattern (S110), the hard mask patterns may be formed by stacking a support mask layer, a polycrystalline silicon layer, and a hard mask layer on a substrate, and etching the hard mask layer. First, a support mask layer 120a, a polycrystalline silicon layer 130a, and a hard mask layer may be sequentially stacked on a top surface of a substrate 110. In an example embodiment, additional layers may be provided among the support mask layer 120a, the polycrystalline silicon layer 130a, and the hard mask layer. Hard mask patterns 140 may be formed by etching the hard mask layer deposited on the top surface of the polycrystalline silicon layer 130a. In this case, the hard mask layer may be etched, e.g., by a photolithography process using a photomask. An anti-reflective film and a photoresist layer may be deposited on the hard mask layer, and the hard mask patterns 140 may be formed using a photomask.

The substrate 110 may be, e.g., a single crystalline silicon substrate or a silicon-on-insulator (SOI) substrate. The support mask layer 120a may be deposited to a certain thickness on the top surface of the substrate 110. The support mask layer 120a may be formed of a material having etch selectivity with respect to the substrate 110 and the polycrystalline silicon layer 130a. The support mask layer 120a may be formed of, e.g., silicon oxide. The support mask layer 120a may be formed to the certain thickness. The polycrystalline silicon layer 130a may be deposited to a predetermined thickness on the top surface of the support mask layer 120a. The polycrystalline silicon layer 130a may be formed, e.g., to have a thickness that is less than that of the support mask layer 120a. The polycrystalline silicon layer 130a may be formed by, e.g., chemical vapor deposition.

The hard mask layer may be deposited on the top surface of the polycrystalline silicon layer 130a to a predetermined thickness. The hard mask layer may be formed of, e.g., a carbon-containing material such as a spin-on hard mask (SOH) or an amorphous carbon layer (ACL). The hard mask layer may be formed by, e.g., spin coating. The hard mask layer may be formed of, e.g., silicon oxide, silicon oxynitride, silicon nitride, or tetra-ethyl-ortho-silicate (TEOS). The hard mask layer may be formed by, e.g., atomic layer deposition or chemical vapor deposition.

A number of the hard mask patterns 140 corresponding to the number of active pin units may be formed. The hard mask patterns 140 may be formed to have different widths according to the activation pin units. The hard mask patterns 140 may be formed to have an appropriate width and spaced an appropriate distance from each other according to active pin units to be formed. For example, the hard mask patterns 140 may have a width corresponding to the sum of a width of a central active pin among three active pins and the distance between opposing surfaces of left and right activation pins. As another example, the hard mask patterns 140 may have a width corresponding to the distance between inner surfaces of two outer active pins among the active pin unit.

Figure 2B:
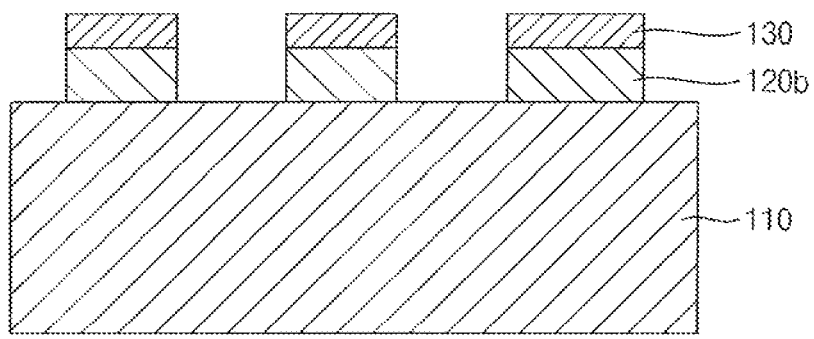

Referring to FIGS. 1 and 2B, in the forming of the polycrystalline silicon patterns (S115), the polycrystalline silicon patterns may be formed by etching the polycrystalline silicon layer using the hard mask patterns as an etch mask, and pre-support mask patterns may be formed by etching the support mask layer. Polycrystalline silicon patterns 130 may be formed by etching the polycrystalline silicon layer 130a. The polycrystalline silicon patterns 130 may be formed to have the same width as the hard mask patterns 140. Pre-support mask patterns 120b having a width corresponding to that of the polycrystalline silicon patterns 130 may be formed by etching the support mask layer 120a by a separate process. The support mask layer 120a may be formed of the material having etch selectivity with respect to the polycrystalline silicon layer 130a and thus support mask patterns may be formed by etching the support mask layer 120a by a separate process. The top surface of the substrate 110 may be exposed at opposite sides of the polycrystalline silicon patterns 130 and the pre-support mask patterns 120b. The polycrystalline silicon layer 130a and the support mask layer 120a may be etched by an etching process.

The polycrystalline silicon patterns 130 may be formed to a thickness suitable to prevent a region thereof not supported by the support mask patterns from being deformed in a subsequent process. Thus, the polycrystalline silicon layer 130a may be formed to a thickness sufficient to secure a desired thickness of the polycrystalline silicon patterns 130. The polycrystalline silicon layer 130a may be proportional to a width of the polycrystalline silicon patterns 130 not supported by the support mask patterns.

Figure 2C:
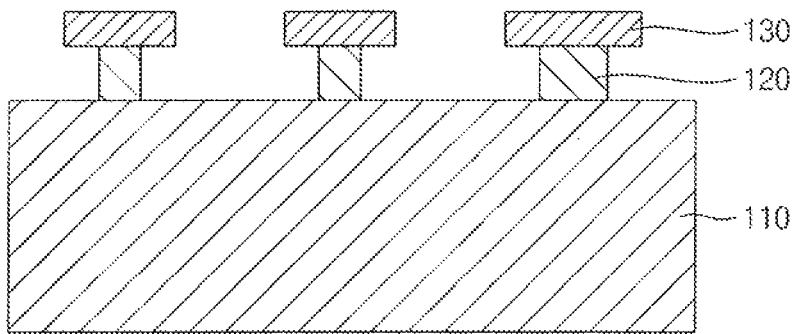

Referring to FIGS. 1 and 2C, in the forming of the support mask patterns (S120), the support mask patterns may be formed by etching the pre-support mask patterns located below the polycrystalline silicon patterns. Support mask patterns 120 may be formed by etching the pre-support mask patterns 120b, e.g., by an ashing process. The support mask layer 120a may be formed to have a thickness greater than that of the polycrystalline silicon layer 130a. Thus, the pre-support mask patterns 120b may also be formed to have a thickness greater than that of the polycrystalline silicon patterns 130. Thus, exposed side surfaces of the pre-support mask patterns 120b may be large in height and thus the pre-support mask patterns 120b may be more easily etched. The polycrystalline silicon patterns 130 and the substrate 110 may have etch selectivity with respect to the pre-support mask patterns 120b so as not to be etched during the etching of the pre-support mask patterns 120b. As the pre-support mask patterns 120b are etched, the top surface of the substrate 110 may be additionally exposed at the opposite sides of the support mask patterns 120.

The support mask patterns 120 may be formed to have a width less than that of the polycrystalline silicon patterns 130. The support mask patterns 120 may be formed to have a width corresponding to that of the central activation pin. A width of etched portions of the pre-support mask patterns 120b may correspond to the distance between the activation pins. Accordingly, the support mask patterns 120 may be formed by etching the pre-support mask patterns 120b to have a width corresponding to the distance between the activation pins. The support mask layer 120a may be formed to have a thickness sufficient to perform isotropic etching during the forming of the support mask patterns 120. When the thickness of the support mask layer 120a is extremely small, the support mask layer 120a may not be uniformly etched and thus the support mask patterns 120 may not be uniformly formed. The hard mask patterns 140 on the polycrystalline silicon patterns 130 may be removed by an ashing process or the like.

Figure 2D:
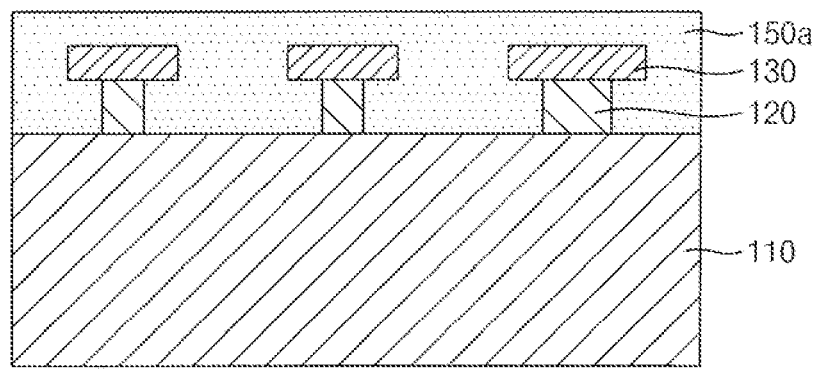

Referring to FIGS. 1 and 2D, in the depositing of the intermediate mask layer (S125), the intermediate mask layer may be formed on the top surface of the substrate to cover side surfaces of the support mask patterns and the polycrystalline silicon patterns. An intermediate mask layer 150a may be formed on the substrate 110 to have a height greater than at least a height of the support mask patterns 120. The intermediate mask layer 150a may be formed to have a height greater than that of top surfaces of the polycrystalline silicon patterns 130. The intermediate mask layer 150a may also be formed in regions between adjacent support mask patterns 120 and between adjacent polycrystalline silicon patterns 130. A top surface of the intermediate mask layer 150a may be planarized by a planarization process. The planarization process may be a process such as a chemical mechanical polishing (CMP) process or an etch-back process.

The intermediate mask layer 150a may be formed of a material having etch selectivity with respect to the substrate 110 and the polycrystalline silicon patterns 130. The intermediate mask layer 150a may be formed of, e.g., a carbon-containing material such as an SOH or an ACL. The intermediate mask layer 150a may be formed by, e.g., spin coating. The intermediate mask layer 150a may be formed of, e.g., silicon oxide, silicon oxynitride, silicon nitride, or TEOS. The intermediate mask layer 150a may be formed by, e.g., atomic layer deposition or chemical vapor deposition.

Figure 2E:
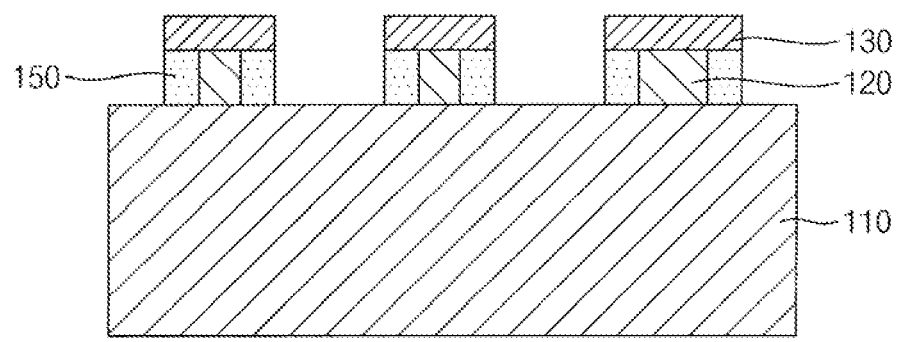

Referring to FIGS. 1 and 2E, in the forming of the intermediate mask patterns (S130), the intermediate mask patterns may be formed by anisotropically etching the intermediate mask layer using the polycrystalline silicon patterns as an etch mask. Intermediate mask patterns 150 may be located in regions between the top surface of the substrate 110, bottom surfaces of the polycrystalline silicon patterns 130, and side surfaces of the support mask patterns 120. Thus, the intermediate mask patterns 150 may be formed in contact with the side surfaces of the support mask patterns 120 and have a width corresponding to that of the bottom surfaces of the polycrystalline silicon patterns 130 exposed via side portions of the support mask patterns 120. The intermediate mask patterns 150 may be formed at opposite sides of the support mask patterns 120. The intermediate mask patterns 150 may be formed at the opposite sides of the support mask patterns 120 to have the same width. The intermediate mask patterns 150 may be formed to have a width corresponding to the distance between the activation pins.

Figure 2F:
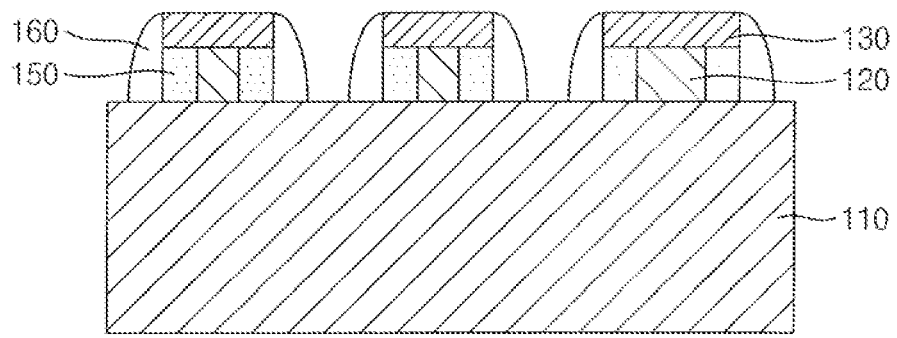

Referring to FIGS. 1 and 2F, in the forming of the spacer patterns (S135), the spacer patterns may be formed to cover side surfaces of the intermediate mask patterns. Spacer patterns 160 may be formed by forming a spacer pattern layer covering the exposed top surface of the substrate 110, the side surfaces of the intermediate mask patterns 150, and the side surfaces and top surfaces of the polycrystalline silicon patterns 130, and anisotropically etching the spacer pattern layer.

The spacer pattern layer may be formed of a material having etch selectivity with respect to the substrate 110 and the polycrystalline silicon patterns 130. For example, the spacer pattern layer may be formed of silicon oxide or silicon nitride. The spacer pattern layer may be formed by, e.g., atomic layer deposition. The spacer patterns 160 may be formed by anisotropically etching the spacer pattern layer to expose the top surfaces of the polycrystalline silicon patterns 130 and the top surface of the substrate 110.

The spacer patterns 160 may be formed to cover the intermediate mask patterns 150. In an example embodiment, the spacer patterns 160 may be formed to additionally cover side surfaces of the polycrystalline silicon patterns 130. The spacer patterns 160 may be formed to conformally cover the polycrystalline silicon patterns 130 and the intermediate mask patterns 150. The spacer patterns 160 may be formed such that one side surface of each of the spacer patterns 160 is in contact with a side surface of each of the polycrystalline silicon patterns 130 and a side surface of each the intermediate mask patterns 150, and the other side surface of each of the spacer patterns 160 is exposed to the outside. A width of the spacer patterns 160 may correspond to that of active pins to be formed. The spacer patterns 160 may serve as an etch mask to form active pins at both sides thereof.

Figure 2G:
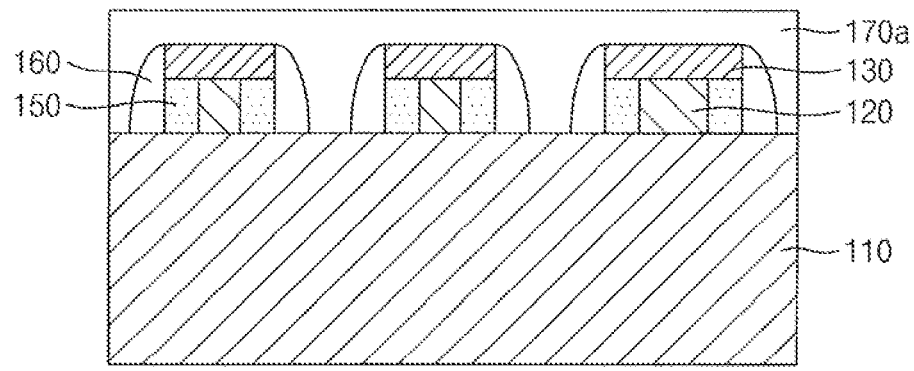

Referring to FIGS. 1 and 2G, in the depositing of the sacrificial layer (S140), the sacrificial layer may be formed on the top surface of the substrate to cover the spacer patterns and the polycrystalline silicon patterns.

A sacrificial layer 170a may be formed on the top surface of the substrate 110 to have a height greater than that of the top surfaces of the polycrystalline silicon patterns 130. The sacrificial layer 170a may be formed to surround the side surfaces of the spacer patterns 160 and the top surfaces of the polycrystalline silicon patterns 130. The sacrificial layer 170a may be formed to cover the side surfaces of the spacer patterns 160 and the top surfaces of the polycrystalline silicon patterns 130. In an example embodiment, the sacrificial layer 170a may be formed in a region between adjacent spacer patterns 160. The sacrificial layer 170a may be formed such that a top surface thereof forms a plane. The sacrificial layer 170a may be formed on the top surface of the substrate 110 such that a region between the polycrystalline silicon patterns 130 and the spacer patterns 160 is coplanar with a region between the spacer patterns 160. The top surface of the sacrificial layer 170a may be planarized by a planarization process. The planarization process may include, e.g., a CMP process, an etch-back process, or a combination thereof.

The sacrificial layer 170a may be formed of a material having etch selectivity with respect to the spacer patterns 160 and the support mask patterns 120. The sacrificial layer 170a may be formed of, e.g., a carbon-containing material such as an SOH. The sacrificial layer 170a may be formed by, e.g., spin coating. The sacrificial layer 170a may be formed of, e.g., silicon oxide, silicon oxynitride, silicon nitride, TEOS, or an ACL. The sacrificial layer 170a may be formed by, e.g., atomic layer deposition or chemical vapor deposition.

Figure 2H:
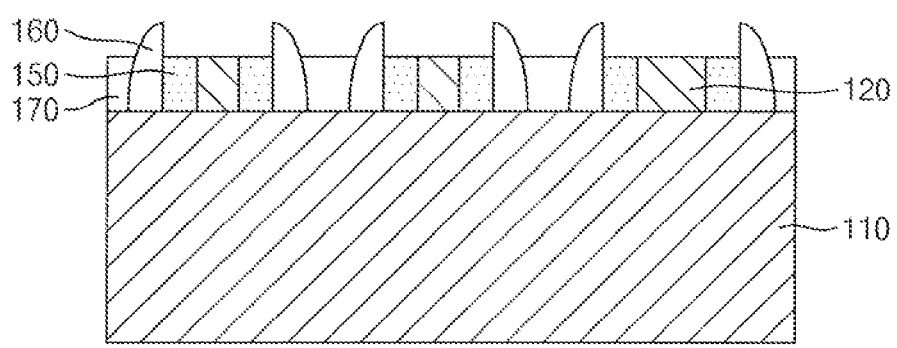

Referring to FIGS. 1 and 2H, in the etching of the polycrystalline silicon patterns (S145), sacrificial patterns may be formed by etching the sacrificial layer to expose the polycrystalline silicon patterns, and the sacrificial patterns and the polycrystalline silicon patterns may be etched together.

First, the sacrificial layer 170a may be etched to expose the top surfaces of the polycrystalline silicon patterns 130. The sacrificial layer 170a in addition to regions on which the polycrystalline silicon patterns 130 are formed may be entirely etched. Further, the sacrificial layer 170a may be etched such that regions thereof at opposite sides of the spacer patterns 160 are etched to the height of the support mask patterns 120. According to a degree of etching the sacrificial layer 170a, the regions of the sacrificial layer 170a at opposite sides of the spacer patterns 160 may be etched to be higher or lower than the height of the support mask patterns 120. The sacrificial layer 170a may be etched to be leveled with the intermediate mask patterns 150. Thus, sacrificial patterns 170 may be formed from the sacrificial layer 170a between adjacent spacer patterns 160. The sacrificial layer 170a may be etched by an etch-back process.

The top surface of the substrate 110 between adjacent spacer patterns 160 may be covered with the sacrificial patterns 170. The sacrificial patterns 170 may be formed to cover outer side surfaces of the spacer patterns 160.

Next, the polycrystalline silicon patterns 130 may be etched. The polycrystalline silicon patterns 130 may be etched by an etching process. As the polycrystalline silicon patterns 130 are etched, upper portions of the spacer patterns 160, the top surfaces of the support mask patterns 120, and the top surfaces of the intermediate mask patterns 150 may be exposed.

The sacrificial patterns 170 may serve as an etch stop film with respect to the substrate 110 during the etching of the polycrystalline silicon patterns 130. The sacrificial patterns 170 may prevent the substrate 110 from being etched during the etching of the polycrystalline silicon patterns 130. In the absence of the sacrificial patterns 170, not only the top surfaces of the polycrystalline silicon patterns 130 but also the top surface of the substrate 110 may be exposed, such that the substrate 110 may be etched during the etching of the polycrystalline silicon patterns 130.

Figure 2I:
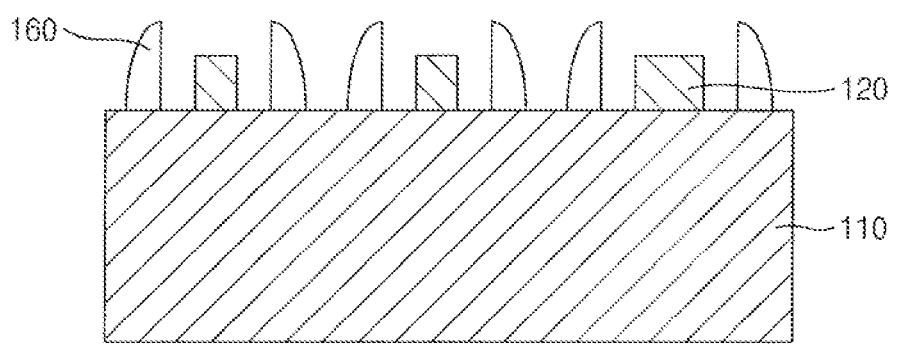

Referring to FIGS. 1 and 2I, in the etching of the intermediate mask patterns and the sacrificial patterns (S150), the intermediate mask patterns and the sacrificial patterns may be removed by etching. When the intermediate mask patterns 150 and the sacrificial patterns 170 are etched together, the top surface of the substrate 110 may be exposed. The intermediate mask patterns 150 and the sacrificial patterns 170 have etch selectivity with respect to the support mask patterns 120 and the spacer patterns 160. When the intermediate mask patterns 150 and the sacrificial patterns 170 are removed, the support mask patterns 120 and the spacer patterns 160 may not be etched. The intermediate mask patterns 150 and the sacrificial patterns 170 may be removed by, e.g., an ashing process using oxygen. As the intermediate mask patterns 150 and the sacrificial patterns 170 are removed, the top surface of the substrate 110 may be exposed via the spacer patterns 160 and the support mask patterns 120.

Figure 2J:
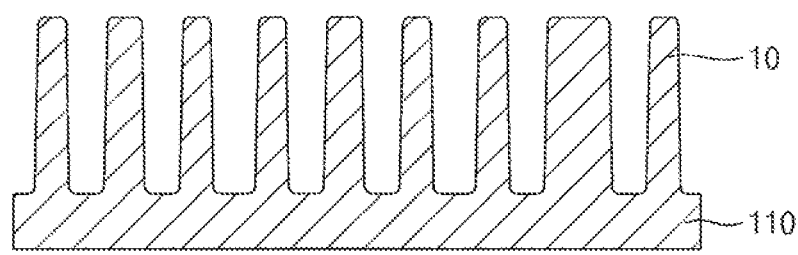

Referring to FIGS. 1 and 2J, in the forming of the pins (S155), activation pins may be formed by etching the substrate using the support mask patterns and the spacer patterns as etch masks. Activation pins 10 may be formed in a planar shape corresponding to those of the support mask patterns 120 and the spacer patterns 160. The activation pins 10 may be formed at locations at which the support mask patterns 120 and the spacer patterns 160 are formed. The activation pins 10 may be formed such that three of the activation pins 10 form one activation pin unit. The activation pin unit may be formed to be spaced different distances from adjacent activation pin units. In an example embodiment, in the forming of the pins (S155), dummy pins may be formed together with the activation pins 10. In another example embodiment, in the forming of the pins (S155), dummy pins may be formed.

Figure 2K:
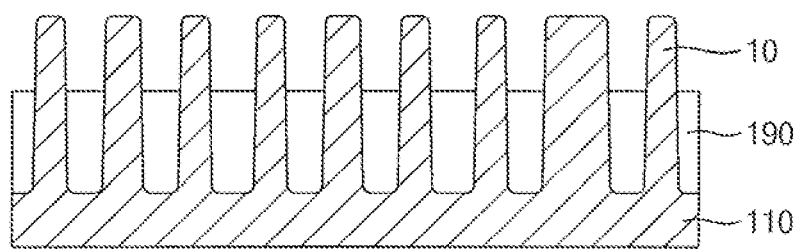

Referring to FIGS. 1 and 2K, in the forming of the isolation film (S160), the isolation film may be formed on the substrate such that upper portions of the activation pins are exposed. An isolation film 190 may be formed to have a height lower than that of the activation pins 10. The isolation film 190 may not contact the upper portions and upper side surfaces of the activation pins 10. The isolation film 190 may electrically insulate the activation pins 10. The isolation film 190 may be formed of, e.g., a high-density plasma oxide film, a spin-on glass (SOG) film, or a chemical vapor deposition oxide film.

Next, a semiconductor device manufacturing method according to an example embodiment will be described.

FIG. 3 is a flowchart illustrating a semiconductor device manufacturing method according to an example embodiment. FIGS. 4A to 4H are cross-sectional views illustrating the semiconductor device manufacturing method according to the example embodiment.

Referring to FIGS. 3 and 4A to 4H, the semiconductor device manufacturing method according to the present example embodiment may include forming hard mask patterns (S210), forming pre-polycrystalline silicon patterns (S215), forming polycrystalline silicon patterns (S220), forming spacer patterns (S225), depositing a sacrificial layer (S230), etching a silicon oxide layer (S235), forming support mask patterns (S240), forming pins (S245), and forming an isolation film (S250).

Figure 4A:
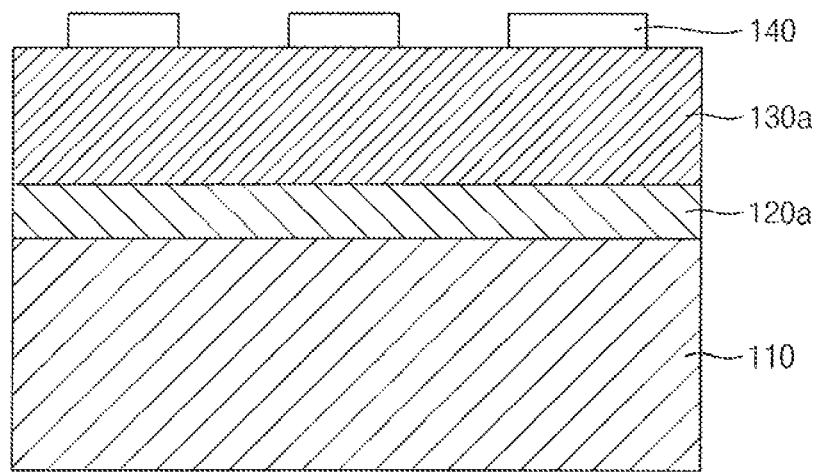
FIGS. 4A to 4H illustrate cross-sectional views of stages of a semiconductor device manufacturing method according to an example embodiment.

Referring to FIGS. 3 and 4A, in the forming of the hard mask patterns (S210), the hard mask patterns may be formed by sequentially forming a support mask layer, a polycrystalline silicon layer, and a hard mask layer on a substrate, and etching the hard mask layer. The forming of the hard mask patterns (S210) may be substantially the same as the forming of the hard mask patterns (S110) according to the embodiment of FIG. 1 and thus is not further described.

According to the present example embodiment, a polycrystalline silicon layer 130a is formed to have a thickness corresponding to a depth to which polycrystalline silicon patterns 130 are oxidized. Pre-polycrystalline silicon patterns 130b are formed from the polycrystalline silicon layer 130a and a top surface and opposite side surfaces thereof are oxidized to form the polycrystalline silicon patterns 130.

Figure 4B:
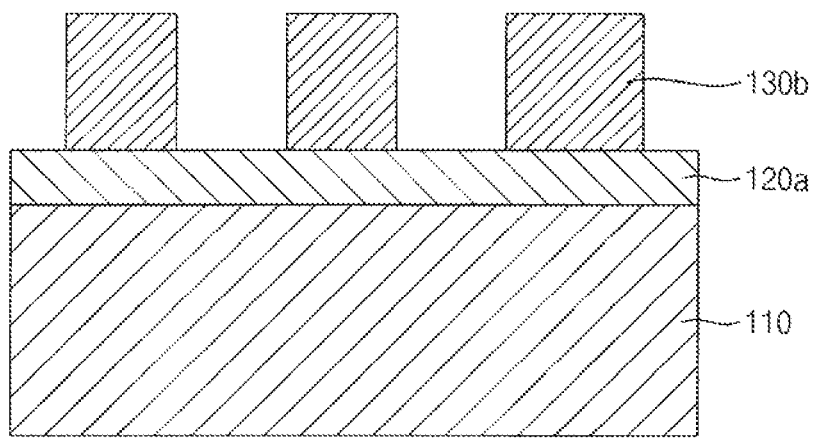

Referring to FIGS. 3 and 4B, in the forming of the pre-polycrystalline silicon patterns (S215), the pre-polycrystalline silicon patterns may be formed by etching the polycrystalline silicon layer using hard mask patterns as an etch mask. The pre-polycrystalline silicon patterns 130b may be formed by etching the polycrystalline silicon layer 130a using hard mask patterns 140 as an etch mask. The polycrystalline silicon layer 130a may be etched by an etching process. In this case, a support mask layer 120a below the polycrystalline silicon layer 130a may not be etched. Accordingly, a top surface of the support mask layer 120a may be exposed via opposite sides of the pre-polycrystalline silicon patterns 130b.

Figure 4C:
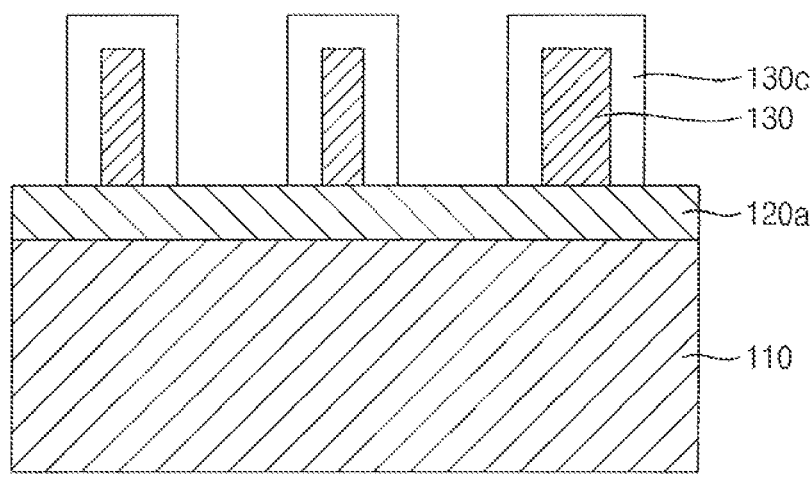

Referring to FIGS. 3 and 4C, in the forming of the polycrystalline silicon patterns (S220), the polycrystalline silicon patterns and a silicon oxide layer may be formed by oxidizing top surfaces and opposite side surfaces of the pre-polycrystalline silicon patterns. A silicon oxide layer 130c may be formed by oxidizing inner sides of the top surface and the opposite side surfaces of the pre-polycrystalline silicon patterns 130b to have a certain thickness. The pre-polycrystalline silicon patterns 130b may be changed into the silicon oxide layer 130c formed on top surfaces and opposite side surfaces of the polycrystalline silicon patterns 130 located inside the silicon oxide layer 130c. Thus, the silicon oxide layer 130c may be formed to have a certain thickness to cover opposite side surfaces and top surfaces of the polycrystalline silicon patterns 130. The silicon oxide layer 130c may be formed by oxidizing the pre-polycrystalline silicon patterns 130b. The hard mask patterns 140 may be removed before the oxidation of the polycrystalline silicon layer 130a. The hard mask patterns 140 may be removed by, e.g., an ashing process.

The silicon oxide layer 130c may be formed by oxidizing the inner sides of the top surfaces and opposite side surfaces of the pre-polycrystalline silicon patterns 130b, and thus may be formed to have the same thickness on the opposite side surfaces of the polycrystalline silicon patterns 130. The silicon oxide layer 130c may be formed to have a thickness corresponding to a distance between activation pins. A width of the polycrystalline silicon patterns 130 may correspond to that of a central activation pin. The width of the polycrystalline silicon patterns 130 and the thickness of the silicon oxide layer 130c may be controlled according to an oxidization time.

When pre-polycrystalline silicon patterns 130b are formed to have different widths, the polycrystalline silicon patterns 130 may be formed to have different widths. In more detail, the silicon oxide layer 130c may be uniformly formed by oxidizing the pre-polycrystalline silicon patterns 130b and thus may have the same width. The polycrystalline silicon patterns 130 located inside the silicon oxide layer 130c have a width that is equal to a result of subtracting double the width of the silicon oxide layer 130c from the width of each of the pre-polycrystalline silicon patterns 130b. Accordingly, the width of the polycrystalline silicon patterns 130 may vary according to that of the pre-polycrystalline silicon patterns 130b.

Figure 4D:
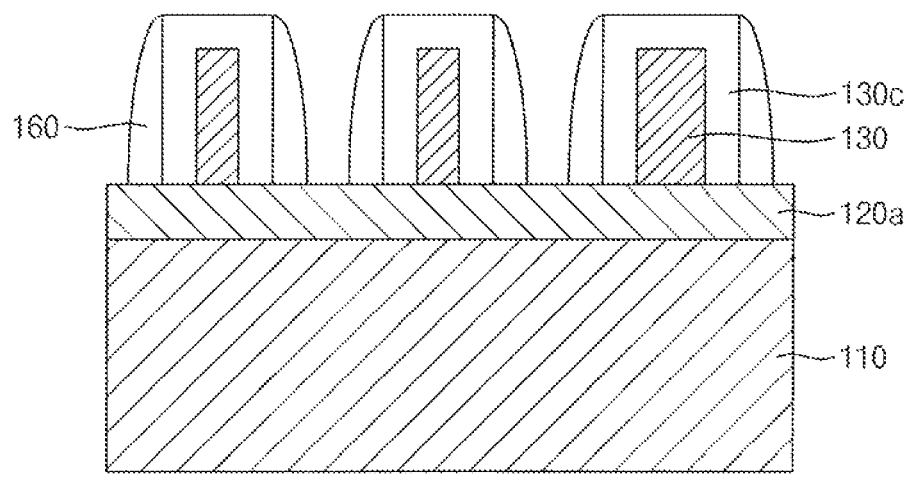

Referring to FIGS. 3 and 4D, in the forming of the spacer patterns (S225), the spacer patterns covering side surfaces of the silicon oxide layer may be formed. Spacer patterns 160 may be formed by forming a spacer pattern layer covering the top surface and side surfaces of the silicon oxide layer 130c and the top surface of the support mask layer 120a and anisotropically etching the spacer pattern layer.

The spacer pattern layer may be formed of a material having etch selectivity with respect to the support mask layer 120a and the silicon oxide layer 130c. For example, the spacer pattern layer may be formed of silicon nitride. Spacer patterns 160 may be formed by anisotropically etching the spacer pattern layer such that the top surface of the silicon oxide layer 130c is exposed. The spacer patterns 160 may be formed to entirely cover the side surfaces of the silicon oxide layer 130c. The spacer patterns 160 may be formed to be level with the silicon oxide layer 130c. The spacer patterns 160 may be formed to conformally cover the silicon oxide layer 130c. The top surface of the support mask layer 120a may be exposed between the spacer patterns 160. The spacer patterns 160 may be formed such that one side surface of each of the spacer patterns 160 is in contact with a side surface of the silicon oxide layer 130c and the other side surface of each of the spacer patterns 160 is exposed to the outside. The spacer patterns 160 may be formed to have a width corresponding to that of activation pins to be formed. The spacer patterns 160 may serve as an etch mask to form activation pins at opposite sides thereof.

Figure 4E:
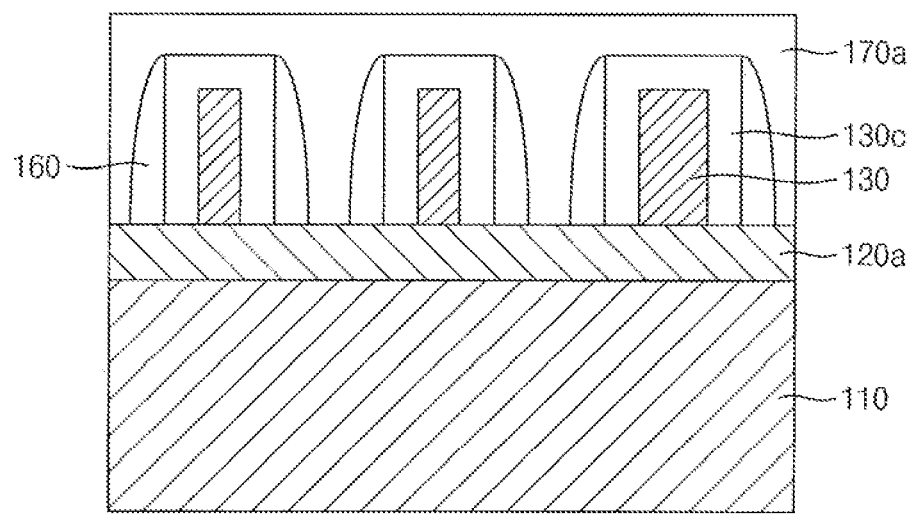

Referring to FIGS. 3 and 4E, in the depositing of the sacrificial layer (S230), the sacrificial layer may be formed on the top surface of the support mask layer to cover the top surface of the silicon oxide layer and the spacer patterns. A sacrificial layer 170a may be formed to cover the tops surface of the silicon oxide layer 130c and side surfaces of the spacer patterns 160. The sacrificial layer 170a may also be formed in a region between adjacent spacer patterns 160. The sacrificial layer 170a may be formed on the top surface of the support mask layer 120a to be at a height greater than the top surface of the silicon oxide layer 130c. The sacrificial layer 170a may be formed such that a region thereof in which the silicon oxide layer 130c is formed is coplanar with a region thereof in which silicon oxide layer 130c is not formed on the top surface of the support mask layer 120a. The top surface of the sacrificial layer 170a may be planarized by a planarization process. The planarization process may include, e.g., a CMP process, an etch-back process, or a combination thereof.

The sacrificial layer 170a may be formed of a material having etch selectivity with respect to the substrate 110 and the polycrystalline silicon patterns 130. In an example embodiment, the sacrificial layer 170a may be formed of a material having etch selectivity with respect to the spacer patterns 160. In an example embodiment, the sacrificial layer 170a may be formed of a material having a higher or lower etch selectivity than the spacer patterns 160. When the etch selectivity between the sacrificial layer 170a and the spacer patterns 160 is high, the shape of the spacer patterns 160 may be maintained without being etched during the etching of the sacrificial layer 170a. When the etch selectivity between the sacrificial layer 170a and the spacer patterns 160 is low, the spacer patterns 160 may be etched to a relatively large degree during the etching of the sacrificial layer 170a and thus a shape thereof may be significantly changed. The sacrificial layer 170a may be formed of, e.g., silicon oxide. The sacrificial layer 170a may be formed by, e.g., atomic layer deposition or chemical vapor deposition.

Figure 4F:
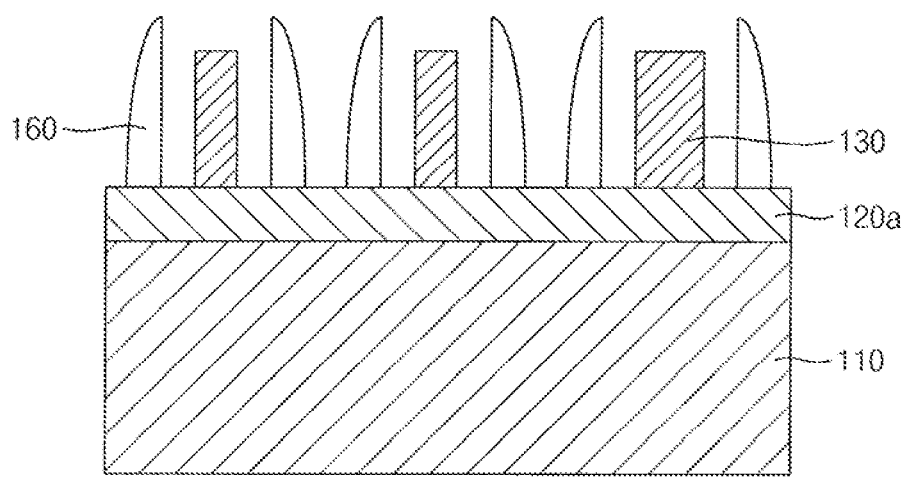

Referring to FIGS. 3 and 4F, in the etching of the silicon oxide layer (S235), the sacrificial layer and the silicon oxide layer may be etched. The sacrificial layer 170a may be etched first, and when the silicon oxide layer 130c is exposed, the sacrificial layer 170a and the silicon oxide layer 130c may be etched together. The etch selectivity between the sacrificial layer 170a and the silicon oxide layer 130c is zero or low. Thus, the sacrificial layer 170a and the silicon oxide layer 130c may be uniformly etched. Thus, the sacrificial layer 170a and the silicon oxide layer 130c on the support mask layer 120a may be entirely uniformly etched to expose the top surface of the support mask layer 120a.

Figure 4G:
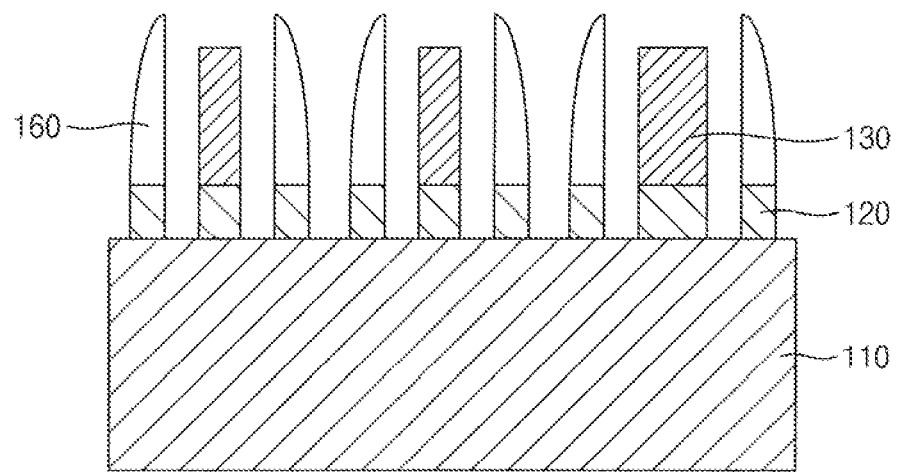

Referring to FIGS. 3 and 4G, in the forming of the support mask patterns (S240), the support mask patterns may be formed by etching the support mask layer using the polycrystalline silicon patterns and the spacer patterns as etch masks. Support mask patterns 120 may be formed in the same planar shape as the polycrystalline silicon patterns 130 and the spacer patterns 160. The support mask layer 120a may be entirely uniformly etched. Thus, the support mask patterns 120 may be uniformly formed in a region of the support mask layer 120a in which the silicon oxide layer 130c is formed and a region thereof in which the silicon oxide layer 130c is not formed.

When the silicon oxide layer 130c and the support mask layer 120a are etched in a state in which the sacrificial layer 170a is not formed, the region of the support mask layer 120a in which the silicon oxide layer 130c is formed and the region thereof in which the silicon oxide layer 130c is not formed may not be uniformly etched. Thus, the region of the support mask layer 120a in which the silicon oxide layer 130c is not formed may be etched together with the silicon oxide layer 130c. The etching of the region of the support mask layer 120a in which the silicon oxide layer 130c is formed may be started after the etching of the silicon oxide layer 130c. Thus, the region of the support mask layer 120a in which the silicon oxide layer 130c is not formed may be additionally etched in a lateral direction after the substrate 110 is etched. In this case, a portion of the support mask pattern 120 formed in the region in which the silicon oxide layer 130c is formed and a portion of the support mask pattern 120 formed in the region in which the silicon oxide layer 130c is not formed may have different widths. The polycrystalline silicon patterns 130 and the spacer patterns 160 remaining on the support mask patterns 120 may be etched by a separate process.

Figure 4H:
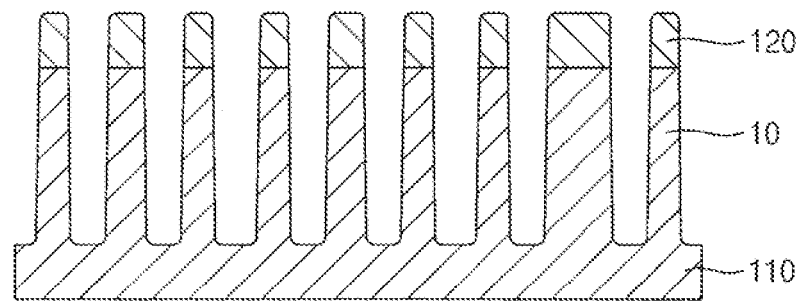

Referring to FIGS. 3 and 4H, in the forming of the pins (S245), activation pins may be formed by etching the substrate using the support mask patterns as an etch mask. The activation pins 10 may be formed in a planar shape corresponding to that of the support mask patterns 120. The activation pins 10 may be formed at locations at which the support mask patterns 120 are formed. The activation pins 10 may be formed such that three of the activation pins 10 form one activation pin unit. Each activation pin unit may be formed to be spaced different distances from adjacent activation pin units.

The forming of the isolation film (S250) may be substantially the same as that of the embodiment of FIG. 1 and thus is not further described.

Next, a semiconductor device manufacturing method according to an example embodiment will be described.

Figure 5:
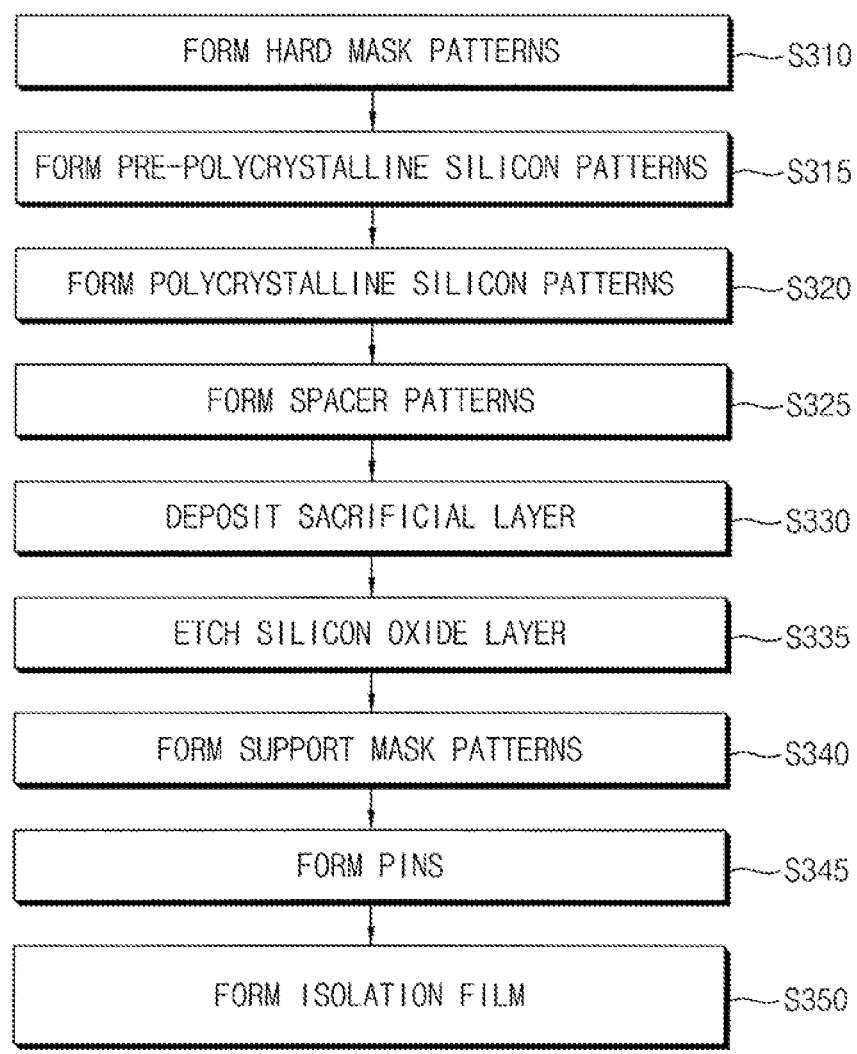
FIG. 5 illustrates a flowchart of a semiconductor device manufacturing method according to an example embodiment.

FIG. 5 is a flowchart illustrating a semiconductor device manufacturing method according to an example embodiment. FIGS. 6A to 6G are cross-sectional views illustrating the semiconductor device manufacturing method according to the example embodiment.

Referring to FIGS. 5 and 6A to 6G, the semiconductor device manufacturing method according to the present example embodiment may include forming hard mask patterns (S310), forming pre-polycrystalline silicon patterns (S315), forming polycrystalline silicon patterns (S320), forming spacer patterns (S325), depositing a sacrificial layer (S330), etching a silicon oxide layer (S335), forming support mask patterns (S340), forming pins (S345), and forming an isolation film (S350). Some operations of the semiconductor device manufacturing method according to the present embodiment may be the same as or similar to those of the embodiment of FIG. 3. Accordingly, the semiconductor device manufacturing method of the present embodiment will be described below focusing on the differences from that of the embodiment of FIG. 3.

Figure 6A:
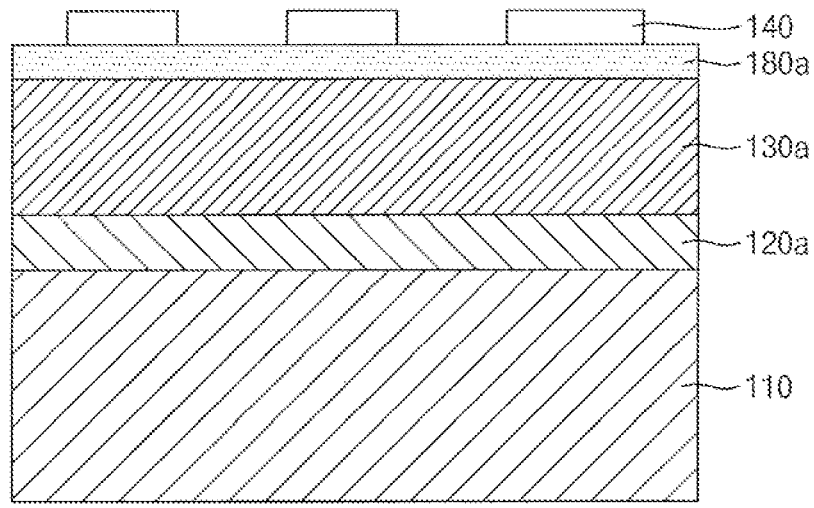
FIGS. 6A to 6G illustrate cross-sectional views of stages of a semiconductor device manufacturing method according to an example embodiment.

Referring to FIGS. 5 and 6A, in the forming of the hard mask patterns (S310), the hard mask patterns may be formed by sequentially depositing a support mask layer, a polycrystalline silicon layer, a blocking layer, and a hard mask layer on a substrate, and etching the hard mask layer. The forming of the hard mask patterns (S310) may be the same as or similar to the forming of the hard mask patterns (S210) of FIG. 3 except for further forming a sacrificial layer 170a between a polycrystalline silicon layer 130a and a hard mask layer, and thus is not further described.

A blocking layer 180a may be formed of a material having etch selectivity with respect to the polycrystalline silicon layer 130a. The blocking layer 180a may be formed of the same material as the support mask layer 120a. The blocking layer 180a may be formed of, e.g., silicon oxide.

Figure 6B:
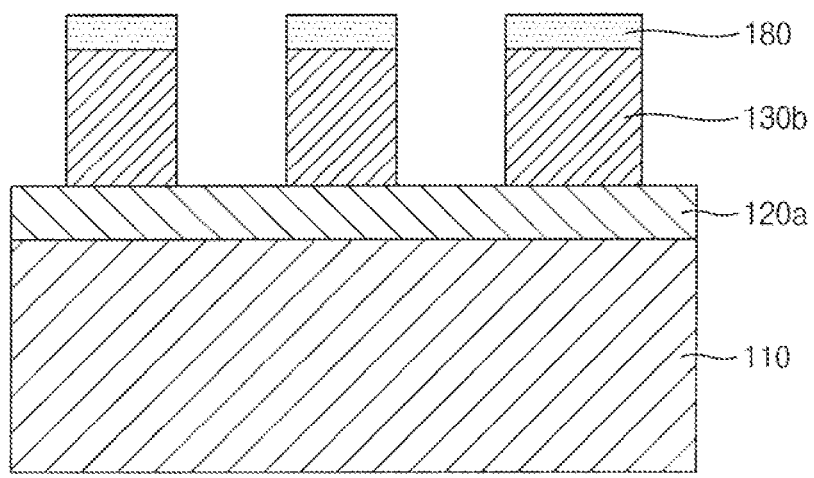

Referring to FIGS. 5 and 6B, in the forming of the pre-polycrystalline silicon patterns (S315), blocking patterns and pre-polycrystalline silicon patterns may be formed by etching the blocking layer and the polycrystalline silicon layer using the hard mask patterns as an etch mask. Blocking patterns 180 may be formed by etching the blocking layer 180a. Pre-polycrystalline silicon patterns 130b may be formed by etching the polycrystalline silicon layer 130a. The blocking layer 180a and the polycrystalline silicon layer 130a may be etched by separate etching processes. In this case, the support mask layer 120a below the polycrystalline silicon layer 130a may not be etched. Accordingly, a top surface of the support mask layer 120a may be exposed via opposite sides of the pre-polycrystalline silicon patterns 130b.

Figure 6C:
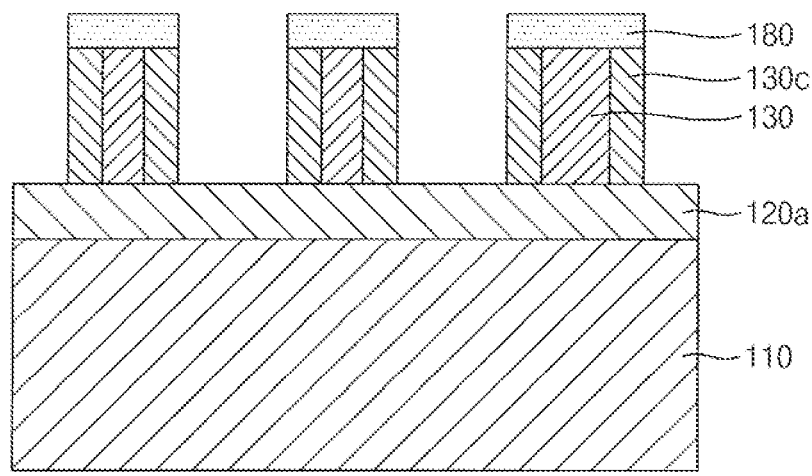

Referring to FIGS. 5 and 6C, in the forming of the polycrystalline silicon patterns (S320), the polycrystalline silicon patterns and a silicon oxide layer may be formed by oxidizing opposite side surfaces of the pre-polycrystalline silicon patterns. The pre-polycrystalline silicon patterns 130b may be oxidized to have a certain thickness from the opposite side surfaces to inner sides thereof. Thus, the opposite side surfaces of the pre-polycrystalline silicon patterns 130b may be changed into a silicon oxide layer 130c having a certain thickness. Hard mask patterns 140 may be removed before the oxidization of the pre-polycrystalline silicon patterns 130b. The hard mask patterns 140 may be removed by an ashing process.

The silicon oxide layer 130c may be formed to have the same thickness at the opposite side surfaces of the pre-polycrystalline silicon patterns 130b. The pre-polycrystalline silicon patterns 130b may not be oxidized due to blocking patterns 180 formed on top surfaces thereof. A silicon oxide layer 130c may be formed to have a thickness corresponding to the distance between activation pins.

Figure 6D:
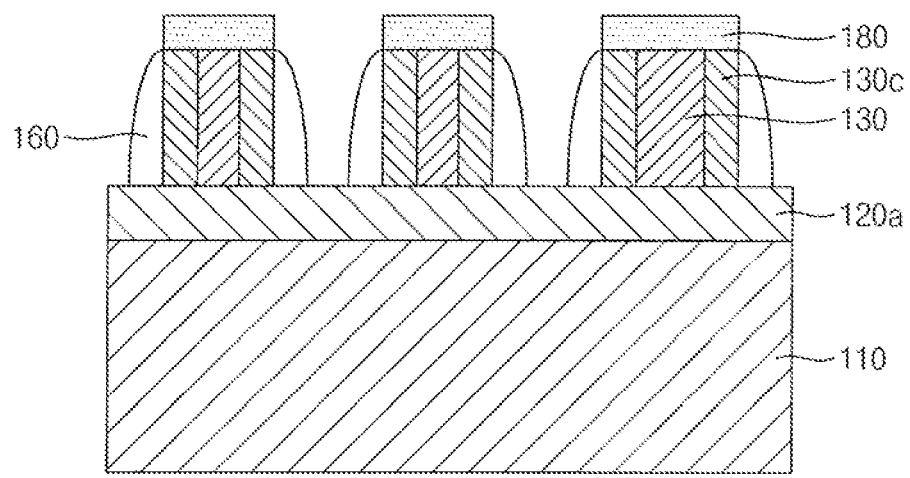

Referring to FIGS. 5 and 6D, in the forming of the spacer patterns (S325), the spacer patterns covering side surfaces of the silicon oxide layer may be formed. Spacer patterns 160 may be formed by forming a spacer pattern layer covering side surfaces of the blocking patterns 180, side surfaces of the silicon oxide layer 130c, and the top surface of the support mask layer 120a, and anisotropically etching the spacer pattern layer. The spacer pattern layer may be formed of a material having etch selectivity with respect to the blocking patterns 180, the silicon oxide layer 130c, and the support mask layer 120a. For example, the spacer pattern layer may be formed of silicon nitride. The spacer pattern layer may be formed by, e.g., atomic layer deposition.

The spacer patterns 160 may be formed to expose the top surface and side surfaces of the blocking patterns 180. The spacer patterns 160 may be formed to entirely cover the side surfaces of the silicon oxide layer 130c. The spacer patterns 160 may be formed to be level with the polycrystalline silicon patterns 130. The spacer patterns 160 may be formed to partially cover the side surfaces of the blocking patterns 180. The top surface of the support mask layer 120a may be exposed between the spacer patterns 160.

Figure 6E:
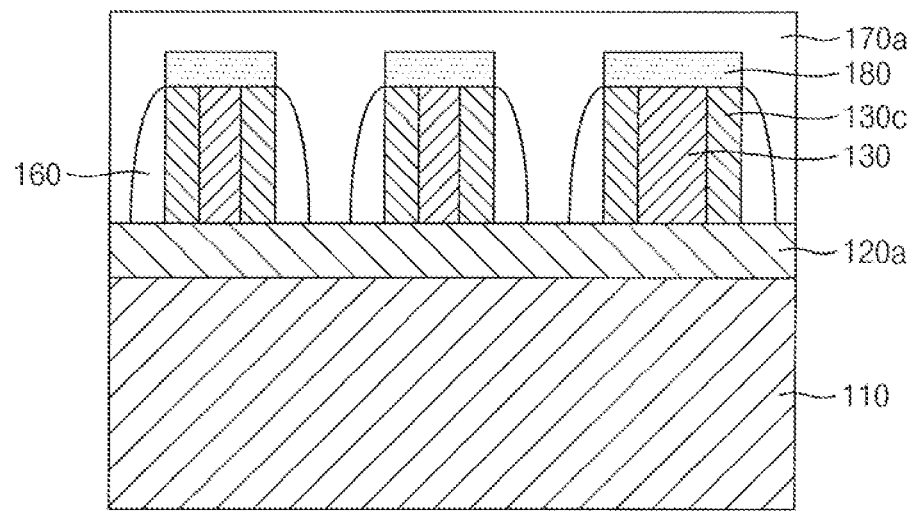

Referring to FIGS. 5 and 6E, in the depositing of the sacrificial layer (S330), a sacrificial layer covering the blocking patterns and the spacer patterns may be formed on the top surface of the support mask layer. The sacrificial layer 170a may be formed to cover the blocking patterns 180 and the spacer patterns 160. The sacrificial layer 170a may also be formed between adjacent spacer patterns 160.

Figure 6F:
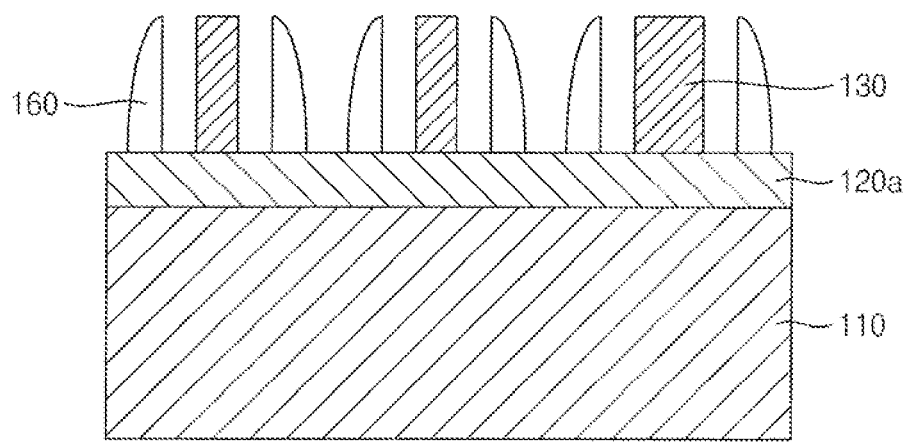

Referring to FIGS. 5 and 6F, in the etching of the silicon oxide layer (S335), the sacrificial layer, the blocking patterns, and the silicon oxide layer may be etched. The sacrificial layer 170a may be etched first, and when the blocking patterns 180 are exposed, the sacrificial layer 170a and the blocking patterns 180 may be etched together. In an example embodiment, when the blocking patterns 180 are etched to expose the silicon oxide layer 130c, the sacrificial layer 170a and the silicon oxide layer 130c may be etched together. The sacrificial layer 170a, the blocking patterns 180, and the silicon oxide layer 130c may have zero or low etch selectivity with respect to one another, and thus may be uniformly etched.

The polycrystalline silicon patterns 130 and the spacer patterns 160 are formed at substantially the same height. Thus, the silicon oxide layer 130c and the sacrificial layer 170a may be uniformly etched downward after the blocking patterns 180 are removed. Thus, the silicon oxide layer 130c and the sacrificial layer 170a may be etched to the support mask layer 120a at the same time. Thus, the sacrificial layer 170a and either the blocking patterns 180 or the silicon oxide layer 130c may be entirely uniformly etched on the support mask layer 120a to expose the top surface of the support mask layer 120a.

Figure 6G:
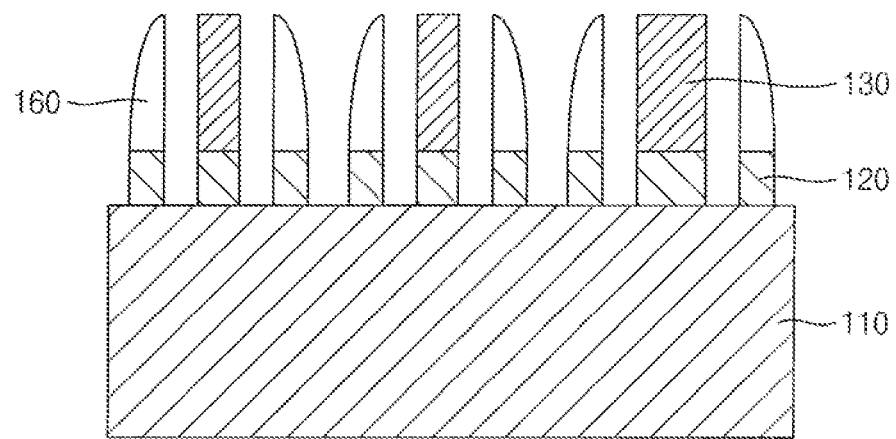

Referring to FIGS. 5 and 6G, in the forming of the support mask patterns, support mask patterns may be formed by etching the support mask layer using the polycrystalline silicon patterns and the spacer patterns as an etch mask. Support mask patterns 120 may be formed in the same planar shape as those of the polycrystalline silicon patterns 130 and the spacer patterns 160. The support mask layer 120a may be entirely uniformly etched. Thus, the support mask patterns 120 may be uniformly formed in a region of the support mask layer 120a in which the silicon oxide layer 130c is formed and a region thereof in which the silicon oxide layer 130c is not formed. The polycrystalline silicon patterns 130 and the spacer patterns 160 remaining on the support mask patterns 120 may be etched by a separate process.

The forming of the pins (S345) and the forming of the isolation film (S350) may be the same as those of the embodiment of FIG. 4 and thus are not further described.

According to the example embodiments, a process for achieving fine patterns for activation pins may be simplified and process costs can be reduced. Further, a margin for prevention of the collapse of patterns during the process may be increased, and a distance dispersion between patterns may be improved, thereby improving the reliability of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, comprising:
    forming hard mask patterns by sequentially depositing a support mask layer, a polycrystalline silicon layer, and a hard mask layer on a substrate, and etching the hard mask layer;
    forming pre-polycrystalline silicon patterns by etching the polycrystalline silicon layer using the hard mask patterns as an etch mask;
    oxidizing opposite side surfaces of the pre-polycrystalline silicon patterns to form polycrystalline silicon patterns and a silicon oxide layer;
    forming spacer patterns covering side surfaces of the silicon oxide layer;
    forming a sacrificial layer on a top surface of the support mask layer to cover the silicon oxide layer and the spacer patterns;
    etching the sacrificial layer and the silicon oxide layer;
    forming support mask patterns by etching the support mask layer using the polycrystalline silicon patterns and the spacer patterns as an etch mask;
    forming activation pins by etching the substrate using the support mask patterns as an etch mask; and
    forming an isolation film on the substrate such that upper portions of the activation pins are exposed.

2. The method as claimed in claim 1, wherein an activation pin unit is formed of three activation pins, and the activation pin unit is formed using one of the hard mask patterns.

3. The method as claimed in claim 2, wherein a width of the silicon oxide layer at opposite sides of the polycrystalline silicon patterns corresponds to distances between a central activation pin and activation pins located at opposite sides of the central activation pin among the activation pins of the activation pin unit.

4. The method as claimed in claim 1, wherein the silicon oxide layer is formed by oxidizing the opposite side surfaces and top surfaces of the pre-polycrystalline silicon patterns.

5. The method as claimed in claim 4, wherein:
the sacrificial layer is formed such that a top surface of the sacrificial layer forms a plane while covering a top surface of the silicon oxide layer and the spacer patterns, and
during the etching of the silicon oxide layer, the sacrificial layer is first etched, and when the silicon oxide layer is exposed, the sacrificial layer and the silicon oxide layer are etched together.

6. The method as claimed in claim 1, wherein:
a blocking layer is formed between the polycrystalline silicon layer and the hard mask layer,
blocking patterns are formed by etching the blocking layer together with the polycrystalline silicon layer, and
the blocking patterns are in contact with top surfaces of the polycrystalline silicon patterns and a top surface of the silicon oxide layer.

7. The method as claimed in claim 6, wherein the sacrificial layer is formed to further cover top surfaces of the blocking patterns.

8. The method as claimed in claim 7, wherein the etching of the silicon oxide layer includes:
when the sacrificial layer is first etched to expose the blocking patterns, etching the sacrificial layer and the blocking patterns together; and
when the blocking patterns are etched to expose the silicon oxide layer, etching the sacrificial layer together with the silicon oxide layer.

9. A method of manufacturing a semiconductor device having an activation pin unit including three activation pins spaced apart from one another, the method comprising:
forming a support mask layer on a substrate;
forming polycrystalline silicon patterns, spacer patterns, and a silicon oxide layer on the support mask layer, the polycrystalline silicon patterns being located at a location corresponding to a central activation pin among the three activation pins of the activation pin unit, the spacer patterns being located at locations corresponding to two other activation pins at opposite sides of the activation pin unit, and the silicon oxide layer having a width corresponding to a distance between the activation pins of the activation pin unit and being located between the polycrystalline silicon patterns and the spacer patterns;
forming a sacrificial layer on the support mask layer to cover the polycrystalline silicon patterns, the spacer patterns, and the silicon oxide layer, the sacrificial layer having a top surface forming a plane; and
etching the sacrificial layer and the silicon oxide layer together to expose a top surface of the support mask layer.

10. The method as claimed in claim 9, wherein:
support mask patterns are formed by etching the support mask layer using the polycrystalline silicon patterns and the spacer patterns as etch masks, and
the activation pins are formed by etching the substrate using the support mask patterns as an etch mask.

11. The method as claimed in claim 9, wherein:
the support mask layer is formed of a material having etch selectivity with respect to the substrate and the polycrystalline silicon patterns, and
the sacrificial layer is formed of a material having etch selectivity with respect to the spacer patterns and the support mask patterns.

12. A method of manufacturing a semiconductor device, comprising:
forming hard mask patterns by sequentially depositing a support mask layer, a polycrystalline silicon layer, and a hard mask layer on a substrate, and etching the hard mask layer;
forming pre-polycrystalline silicon patterns by etching the polycrystalline silicon layer using the hard mask patterns as an etch mask;
oxidizing opposite side surfaces of the pre-polycrystalline silicon patterns to form polycrystalline silicon patterns and a silicon oxide layer;
forming spacer patterns covering side surfaces of the silicon oxide layer;
forming a sacrificial layer on a top surface of the support mask layer to cover the silicon oxide layer and the spacer patterns,
wherein a width of a first set of the polycrystalline silicon patterns formed by oxidizing the pre-polycrystalline silicon patterns is different from a width of a second set of the polycrystalline silicon patterns.

13. The method as claimed in claim 12, further comprising:
etching the sacrificial layer and the silicon oxide layer; and
forming support mask patterns by etching the support mask layer using the polycrystalline silicon patterns and the spacer patterns as an etch mask.

14. The method as claimed in claim 13, further comprising:
forming activation pins by etching the substrate using the support mask patterns as an etch mask; and
forming an isolation film on the substrate such that upper portions of the activation pins are exposed.

15. The method as claimed in claim 14, wherein some of the activation pins are formed to be spaced at different distances from adjacent activation pins.

16. The method as claimed in claim 12, wherein the spacer patterns are formed by forming a spacer pattern layer, and anisotropically etching the spacer pattern layer.

17. The method as claimed in claim 12, wherein the sacrificial layer is also formed in a region between adjacent two of the spacer patterns.

18. The method as claimed in claim 12, wherein the sacrificial layer is formed such that a region of the sacrificial layer in which the silicon oxide layer is formed is coplanar with a region of the sacrificial layer in which the silicon oxide layer is not formed on the top surface of the support mask layer.

19. The method as claimed in claim 18, wherein:
a top surface of the sacrificial layer is planarized by a planarization process, and
the planarization process includes a chemical mechanical polishing process or an etch-back process.

20. The method as claimed in claim 12, wherein the silicon oxide layer is formed to have the same thickness on opposite side surfaces of the polycrystalline silicon patterns.

* * * * *